US006276552B1

United States Patent
Vervisch

(10) Patent No.: US 6,276,552 B1
(45) Date of Patent: Aug. 21, 2001

(54) SEALED CONTAINER LATCH SYSTEM

(76) Inventor: Steve Vervisch, SemiChase, Inc., 2600 Technology, #100, Plano, TX (US) 75074

( * ) Notice: Subject to any disclaimer, the term of this patent is extended or adjusted under 35 U.S.C. 154(b) by 0 days.

(21) Appl. No.: 09/350,727

(22) Filed: Jul. 6, 1999

(51) Int. Cl.[7] .................................................. B65D 45/16
(52) U.S. Cl. ...................... 220/324; 24/598.1; 24/600.7; 220/315; 220/378; 292/111
(58) Field of Search .................................. 292/111, 110, 292/98, 197, 71; 220/324, 325, 378, 315, 326; 190/28; 24/598.1, 600.7

(56) References Cited

U.S. PATENT DOCUMENTS

| 961,780 | * | 6/1910 | Lauzon | 220/324 X |
| 1,531,487 | * | 3/1925 | Lundberg . | |
| 1,871,453 | * | 8/1932 | Cobb | 220/324 X |
| 2,666,092 | * | 1/1954 | Balzer | 220/325 X |
| 2,717,093 | * | 9/1955 | Mautner | 190/28 X |
| 2,794,664 | * | 6/1957 | Kruger | 220/324 X |
| 2,803,368 | * | 8/1957 | Koch | 220/324 X |
| 2,956,827 | * | 10/1960 | Humphries . | |
| 3,464,579 | * | 9/1969 | Asenbauer . | |
| 3,472,545 | * | 10/1969 | Berkowitz | 292/111 |
| 3,661,410 | * | 5/1972 | Larson et al. | 292/111 X |
| 3,784,240 | * | 1/1974 | Berkowitz | 292/111 |
| 3,851,922 | * | 12/1974 | McCoy | 292/111 X |
| 3,885,701 | * | 5/1975 | Becklin | 220/325 |
| 3,951,300 | * | 4/1976 | Kalasek | 220/378 X |
| 4,159,136 | * | 6/1979 | Kimball | 292/111 X |
| 4,298,204 | * | 11/1981 | Jinkins | 220/378 X |
| 4,417,430 | * | 11/1983 | Loikitz | 292/111 X |
| 4,512,122 | * | 4/1985 | Berkowitz | 292/111 X |
| 4,601,409 | | 7/1986 | DiRegolo | 222/1 |
| 5,074,428 | * | 12/1991 | Wildfeuer | 220/378 X |
| 5,271,526 | | 12/1993 | Williams | 222/16 |
| 5,295,602 | * | 3/1994 | Swanson | 220/326 X |
| 5,316,181 | | 5/1994 | Burch | 222/61 |
| 5,390,811 | * | 2/1995 | Ogino et al. | 220/378 X |
| 5,516,429 | | 5/1996 | Snodgrass et al. | 210/767 |
| 5,590,686 | | 1/1997 | Prendergast | 137/597 |
| 5,607,000 | | 3/1997 | Cripe | 141/21 |
| 5,636,762 | | 6/1997 | Juhola | 222/1 |
| 5,641,065 | * | 6/1997 | Owens et al. | 220/324 X |
| 5,657,893 | * | 8/1997 | Hitchings | 220/324 X |
| 5,700,401 | | 12/1997 | Weinberg et al. | 261/27 |

FOREIGN PATENT DOCUMENTS

2632282 * 12/1989 (FR) .
1073689 * 6/1967 (GB) ................................. 220/324

* cited by examiner

Primary Examiner—Allan N. Shoap
Assistant Examiner—Robin A. Hylton
(74) Attorney, Agent, or Firm—Rudolf O. Siegesmund

(57) ABSTRACT

A valve manifold box that can be opened and closed easily and repeatedly while maintaining a sealed environment around the valves when closed by means of a latch system and a prong and groove gasket seal.

15 Claims, 4 Drawing Sheets

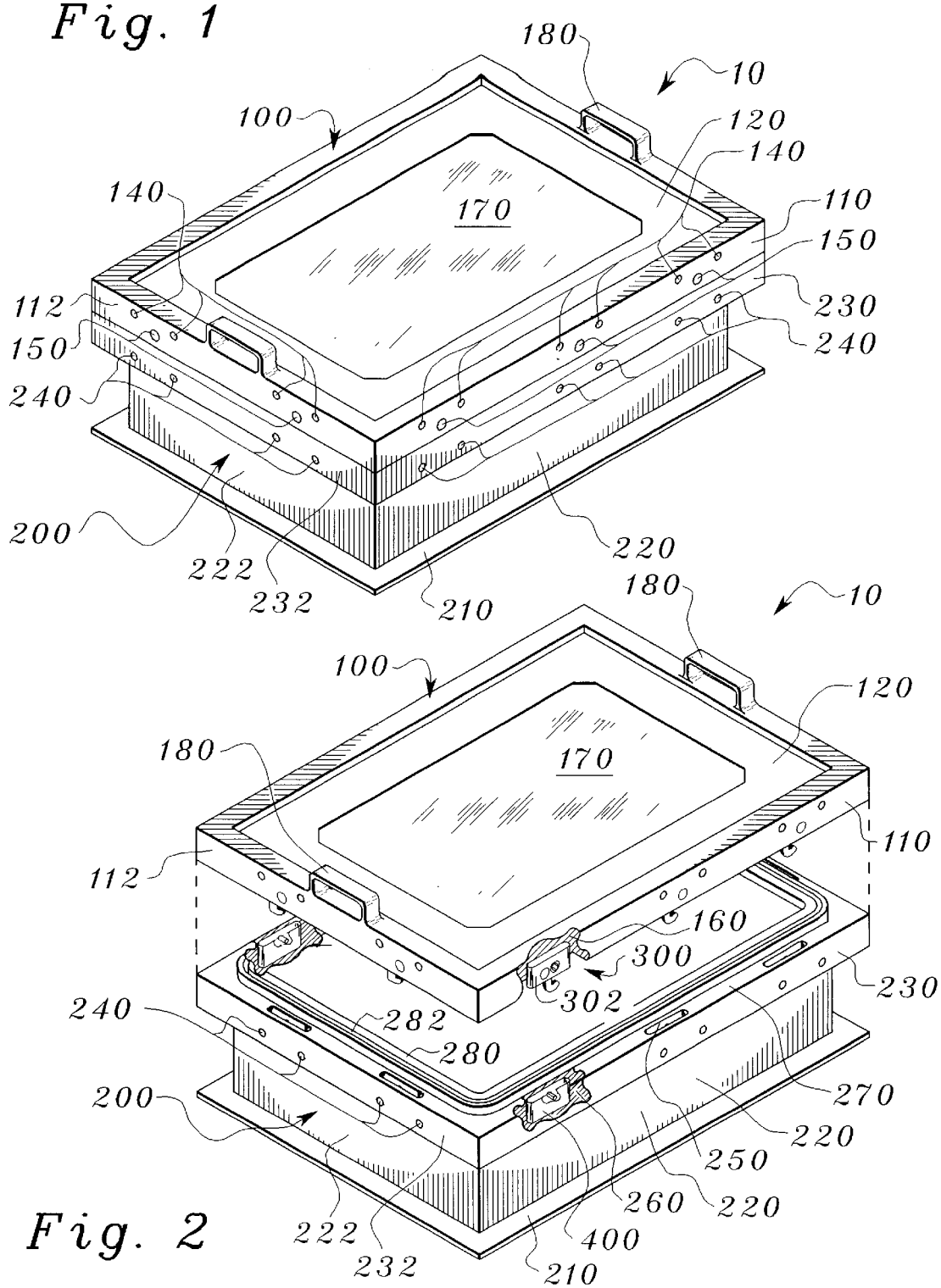

SEALED CONTAINER LATCH SYSTEM

FIELD OF THE INVENTION

The present invention relates, in general, to a valve manifold box that can be opened and closed easily and repeatedly while maintaining a sealed environment around the valves when closed.

BACKGROUND OF THE INVENTION

Semi-conductor chip manufacture requires the use of high purity chemicals and a distribution piping network. Many of the chemicals are hazardous and include volatile organic components. The piping network is subject to strict State and Federal requirements such as the Federal Clean Air Act of 1990. Every connection in the piping network poses a potential leak. While joints and connections in the piping can be welded or otherwise sealed as strongly as the pipe material itself, valves pose a particular area of vulnerability to leaks because of the moving parts contained in valves. In order to protect workers from leaks at the valves, valves for controlling and operating the piping network are contained in a multi-point of use chemical distribution box, known as a valve manifold box. Any number of pipes or lines can be connected to the box in the same manner as other joints in the line where the connection is at least as strong as the pipe or line material itself. The valves are the connected to the pipes and lines inside the valve manifold box The essential feature of the box is that it can be sealed so that in the event of leak the chemicals will be contained. However, the box must be capable of being opened for access to the valves and then closed again with a tight seal. The box must be capable of being opened and closed repeatedly with a tight and reliable seal each time. By sealing the area around the valves, even minor leakage of chemicals will accumulate in sufficient quantity to set of an alarm such as a fiber optic alarm inside the container. The use of a valve manifold box protects employees from exposure to the chemicals and also saves the company money in the event of a leak due to the high cost of these concentrated chemicals.

The valve manifold boxes in use today obtain a seal by using a box with a lid that is secured by a large number of thumbscews. The thumbscrews must be tightened initially by hand and then tightened down with a screwdriver thus requiring at least two manual operations per screw. In some cases the number of thumbscrews can be as high as one hundred or more requiring a large number of manual operations. The labor time involved in undoing such large number of thumbscrews for access and then replacing and seating the thumbscrews for re-sealing is significant. When power driven screw drivers are used to speed up the process the incidence of stripped screws goes up significantly, with a concomitant potential loss of seal effectiveness. Moreover, the monotonous and repetitious task tempts workers to skip thumbscrews or to properly seat only some thumbscrews thereby compromising the integrity of the seal. When access is needed in an emergency or in a very short time span for process control, the access time can be excessive. Therefore, a need exists for a valve manifold box that can be opened and closed quickly while ensuring a strong seal.

The prior art focuses on apparatus and methods for controlling the transfer and flow of chemicals from one container such as a holding container to another such as a process system container. However, the prior art does not address the problem of enclosing a valve manifold system within a sealed container where the valves can be accessed and re-sealed with relative ease. For example, U.S. Pat. No. 5,607,000 to Cripe et. al., discloses a non-venting hazardous material dispensing system which does not address the problem of protecting the control valves in the piping network. U.S. Pat. No. 4,601,409 to DiRegolo discloses a system for dispensing liquid chemicals such as photoresist including a valve to govern the flow from the containers. Once again, the disclosure is directed to solving problems in the flow and process control and does not address the problem of protecting valves in the piping network. Therefore, while valve manifold boxes in various forms are in use the semi-conductor manufacturing industry, there is a need for valve manifold boxes that solve the problem of providing a sealed environment around the valves and that are also capable of being opened and closed repeatedly while maintaining the quality and integrity of the seal.

Therefore, a need exists for a container that can be opened and closed easily and routinely with a minimum number of manual operations while ensuring a seal which will prevent the escape of any possible leaked chemicals.

SUMMARY OF THE INVENTION

The present invention meeting the needs described above consists of a container with a lid and a box which fit together to form a tight seal by the closing of the latches located in the lid and the box. The seal is ensured by a lid having a continuous prong containing a gasket so that when the lid is placed on the box, the prong and gasket enter into a corresponding continuous groove in the box. The gasket first seats in the groove and then deforms to provide an expansive seal when pressure is created by a latch system using a hook and an anchor to pull a latch top and latch bottom together. Alternatively, the box can be constructed with a lid having a continuous blister and a box with a gasket placed over a corresponding continuous blister so that when the lid is pulled down onto the box by means of the latch system, the gasket is squeezed between the two continuous blisters to form a seal. The box can be used in any variety of ways by adapting the sealed environment to different processes. Any number of inlet pipes, outlet pipes, tubes or lines can be connected to the box and sealed. The container meets the need for a container that can be opened and closed numerous times while maintaining a consistent seal. The container also meets the need for a container in which the seal can be achieved without the necessity for a large number of manual operations such as seating of multiple thumbscrews.

The foregoing and other objects, features and advantages of the invention will be apparent from the following more particular description of a preferred embodiment of the invention, as illustrated in the accompanying drawing wherein like reference numbers represent like parts of the invention.

BRIEF DESCRIPTION OF THE DRAWINGS

FIG. 1 shows a perspective view of the container.

FIG. 2 shows an exploded view of the container with the lid raised.

DETAILED DESCRIPTION

Figure 3:
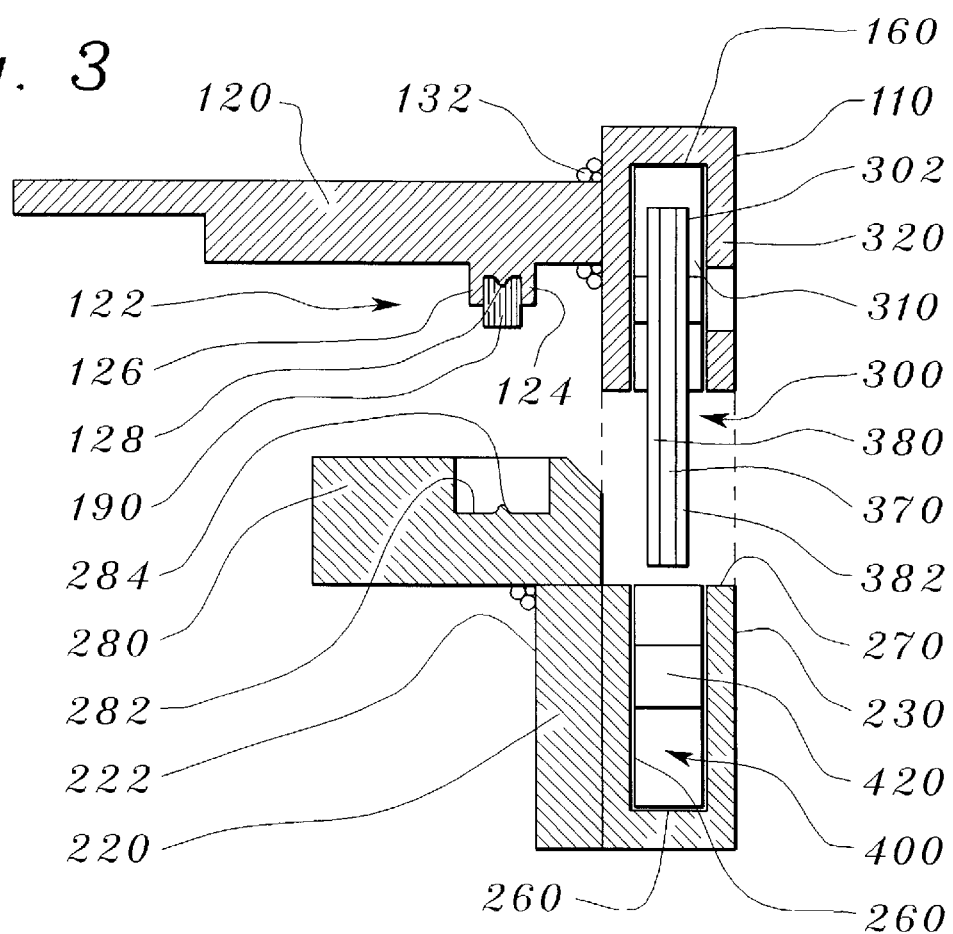
FIG. 3 shows a cross section a section of the sealing system.

FIG. 1 shows container 10 assembled with lid element 100 affixed to box element 200. In FIG. 1 container 10 is assembled and closed. Lid 100 has first lid rails 110, second lid rails 112, top 120 and window 170. First lid rails 110 are shown with latch wrench holes 150 and latch top hex screw holes 140. Second lid side 112 also has wrench holes 150 and latch top hex screw holes 140. Lid 100 has two handles 180 affixed to second lid rails 112. Box element 200 has base 210, first box walls 220, second box walls 222, first box rails 230, and second box rails 232. Container 10 can be used in any position. In the preferred embodiment container 10 is mounted on the wall of a room or building by affixing base 210 to a wall where base 210 is oriented so that first lid rails 110, first box walls 220 and first box rails 230 are parallel to a level floor (not shown). In the preferred embodiment container 10 is a rectangular box with two long it(sides and two shorter sides; however container 10 could be made in any shape to accommodate the process supported by container 10.

The structural components of lid 100, first lid rails 110, second lid rails 112, top 120 and handles 180 are made from polyvinyl chloride. Polyvinyl chloride is used in lid 100 because of its strength and rigidity which provides a strong frame for window 170 made from ⅜ inch clear polyvinyl chloride. Polyvinyl chloride is further used in order to eliminate deformation of box 200 which is made of polypropylene, a less rigid material. In the preferred embodiment, the polyvinyl chloride used has a specific gravity of 1.30 to 1.58 and a tensile strength of 6000 PSI. Another suitable material is Polyvinylidene Chloride (CPVC). The structural components of box 200, base 210, first box walls 220, second box walls 222, first box rails 230, and second box rails 232 are made from polypropylene. The box is made from polypropylene for several reasons. First, in order to introduce the piping network into the box access holes (not shown) must be cut in box and polypropylene is easier to cut. Second, use of polypropylene keeps the cost of the box down. While the polypropylene is not as rigid as the polyvinyl chloride, rigidity is imparted to container 10 by lid 100 when it is properly seated and affixed to box 200. In the preferred embodiment, polypropylene with a specific gravity of 0.905 and a tensile strength of 5000 PSI is used. The specific gravity is important because the chemical resistance of the polypropylene improves with increasing molecular weight.

In an alternative embodiment first lid rails 110, second lid rails 112, top 120 handles 180, base 210, first box walls 220, second box walls 222, first box rails 230, and second box rails 232 are made from stainless steel.

FIG. 2 shows container 10 in a exploded view with lid 100 raised above box 200. Lid 100 has latch top cavities 160 for receiving latch tops 300. Box element 200 has latch bottom cavities 260 for receiving latch bottoms 400. Container 10 may be any size depending on the needs and the limitations imposed by the necessity of manually lifting lid element 100 on and off box element 200. In the preferred embodiment, Latch top 300 and latch bottom 400 remain the same size for all variations of container 10. Therefore, for larger versions of container 10 additional latch top cavities 160 and latch bottom cavities 260 may be necessary. Smaller versions of container 10 will require fewer latch top cavities 160 and latch bottom cavities 260. To insure proper sealing of container 10 latch tops 300 and latch bottoms 400 should be positioned so that there is no more than 12 inches from center to center of adjacent latch tops 300 and adjacent latch bottoms 400. Additionally, there should be no more than six inches from the center of latch tops 300 and latch bottoms 400 and the ends of first lid rails 110, second lid rails 112, first box rails 230 and second box rails 232, respectively.

Latch top cavities 160 are cut from first lid rails 110 and second lid rails 112. In the preferred embodiment latch wrench holes 150 are drilled 0.56 inches through the outer surface of first lid rails 110 and second lid rails 112 into latch top cavities 160 but do not extend into the rear walls of latch top cavities 160. Latch top hex screw holes 140 are drilled and countersunk for ½–20 flat head screws for receiving hex screws (not shown) to secure top latch 300. The rear wall of latch top cavities 160 are drilled and tapped ¼–20×½. Latch bottom cavities 260 are cut from first box rails 230 and second box rails 232. Latch bottom hex screw holes 240 are drilled and countersunk for ½–20 flat head screws for receiving screws to secure top bottom 400. The rear wall of latch bottom cavities 260 are drilled and tapped ¼–20×½. Additional fasteners are within the knowledge of persons skilled in the art.

Box element 200 has box rail top 270, box rail ridge 280 and box rail groove 282. Box rail ridge 280 extends continuously along box rail roof 270 parallel to first walls 220 and second walls 222 so that box rail ridge 280 extends continuously around the inside perimeter of box rail top 270. In the preferred embodiment, when box rail ridge 270 extends from first rails 230 to second rails 232 the junction is curved. Box rail ridge 280 has box rail groove 282 extending continuously within box rail ridge 280. Box rail groove wedge 284 extends continuously within box rail groove 282 and is centered in box rail groove 282.

FIG. 3 shows a cross sectional view of that portion of lid 100 and box 200 which contain latch tops 300 and latch bottoms 400. Top 120 is joined to first lid rail 110. The same view would apply to top 120 joined to second lid rail 112. The preferred method for bonding top 120 to first rails 110 and second rails 112 is by triple bead weld 132. A triangular bead weld can be substituted for triple bead weld wherever a triple bead weld is called for. Top latch 300 is shown affixed within top latch cavity 160. Prong 122 is molded into the bottom surface of top 120. Prong 122 has prong outside wall 124, prong inside wall 126 and prong wedge 128. Gasket 190 is wedged between prong outside wall 124 and prong inside wall 126 so that it is held in place by friction and the force exerted by the compression of prong 190 against prong outside wall 124 and prong inside wall 126. The preferred material for prong 190 is ethylene propylene rubber with a durometer rating of 60. Gasket 190 will not function with a durometer rating of less than 40 or greater than 70. Ethylene Propylene Rubber is used because it is especially suitable for environments with exposure to aggressive chemicals and because of its ability to deform and regain its shape when container 10 is closed and opened repeatedly. Butyl rubber is another appropriate material. Top latch 300 has casing 302, hex nut 320, inside hook 380, outside hook 382 and trigger 370.

The lower half of FIG. 3. depicts a cross sectional view of box rail ridge 280 affixed to box rail 230, and box wall 220. The view of box rail ridge 280 affixed to box rail 232 and box wall 222 would be the same. Latch bottom 400 is shown affixed within latch bottom cavity 260. Latch bottom 400 has latch bottom casing 402 and latch bottom bar 420. Box rail ridge 280 is joined to box wall 220 with triple bead welds. A triangular bead weld can be substituted for triple bead weld wherever a triple bead weld is called for. Box rail groove 282 is rectangular in shape and has groove wedge 284.

Figure 4:
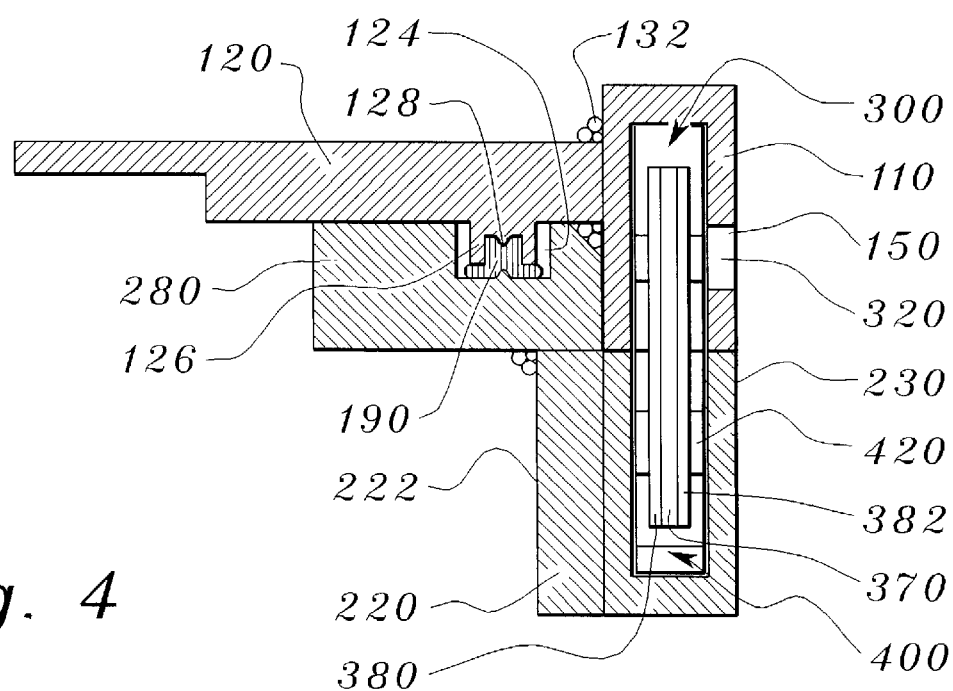
FIG. 4 shows a cross section of the sealing system with the gasket deformed.

FIG. 4. shows the same cross section as FIG. 3 when lid 100 is closed onto box 200. Inside hook 380, outside hook 382 and trigger 370 of latch top 300 have engaged latch bottom bar 420 and prong 122 and gasket 190 have entered box rail groove 282. As top 120 approaches box rail ridge 280 gasket 190 deforms from pressure exerted by prong wedge 128 and groove wedge 284 so that the portion of gasket 190 extending beyond outside wall 126 and inside wall 124 spreads beneath outside wall 126 and inside wall 124 toward the sides of groove 282 forming a tight seal between top 120 and box rail ridge 280. The optimum distance between the tip of prong wedge 126 and groove wedge 284 when lid 100 is closed onto box 200 is 0.110 inches with an allowable tolerance from 0.100 to 0.120 inches.

Figure 5:
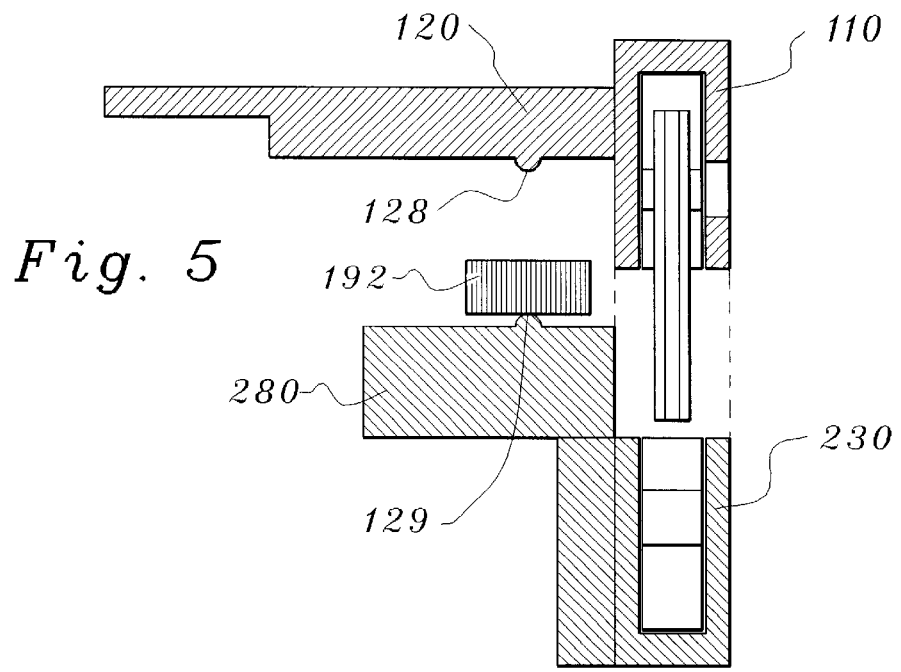
FIG. 5 shows an alternative embodiment of the sealing system.

FIG. 5 depicts a cross sectional view of the stainless steel embodiment of container 10 in which top 120 has top blister 128, box rail 280 has box rail blister 129 and rectangular gasket 192 is affixed over box rail blister 129. Gasket 192 can be affixed to box rail 280 by screws inserted into gasket 192 and box rail 280. Top blister 128 and box rail blister 129 run continuously around the perimeters formed by first lid rails 110, second lid rails 112, first box rails 230 and second box rails 232 respectively, and have square corners rather than rounded corners as in the polypropylene and polyvinyl chloride versions.

Figures 6, 7:
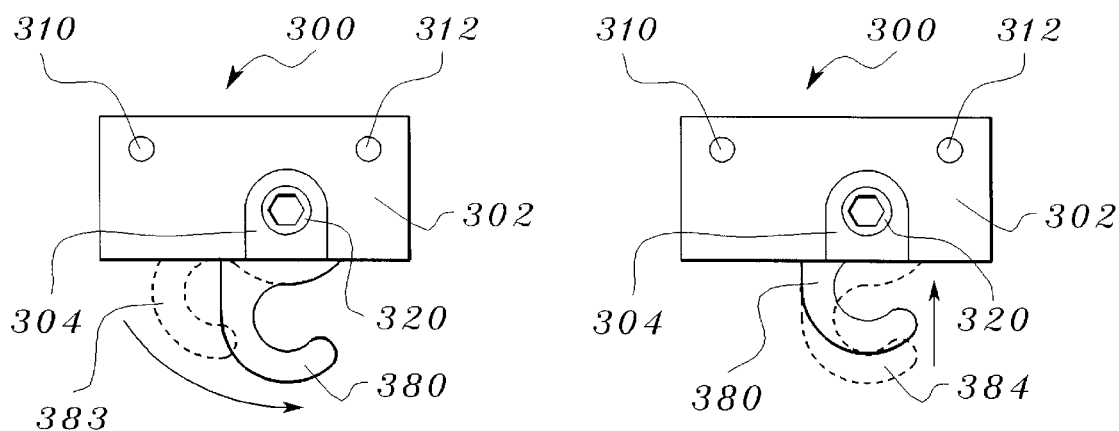
FIG. 6 shows a side view of a latch top.
FIG. 7 shows a side view of a latch top with the hook retracting.

FIG. 6 depicts top latch 300 with casing 302, first securement hole 310 and second securement hole 312, indent 304, hex nut 320 and outside hook 382. Intermediate position 383 of outside hook 382 is shown by broken lines. In FIG. 7 top latch 300 is shown with outside hook 382 in its closed position. The start position 384 for outside hook 382 is shown by a broken line. When hex nut 320 is turned by means of a hex wrench (not shown) outside hook 382, inside hook 380 and trigger 370 (see FIG. 8) will draw upward into casing 302. Inside hook 380 and trigger 370 (see FIG. 8) are hidden by outside hook 382.

Figure 8:
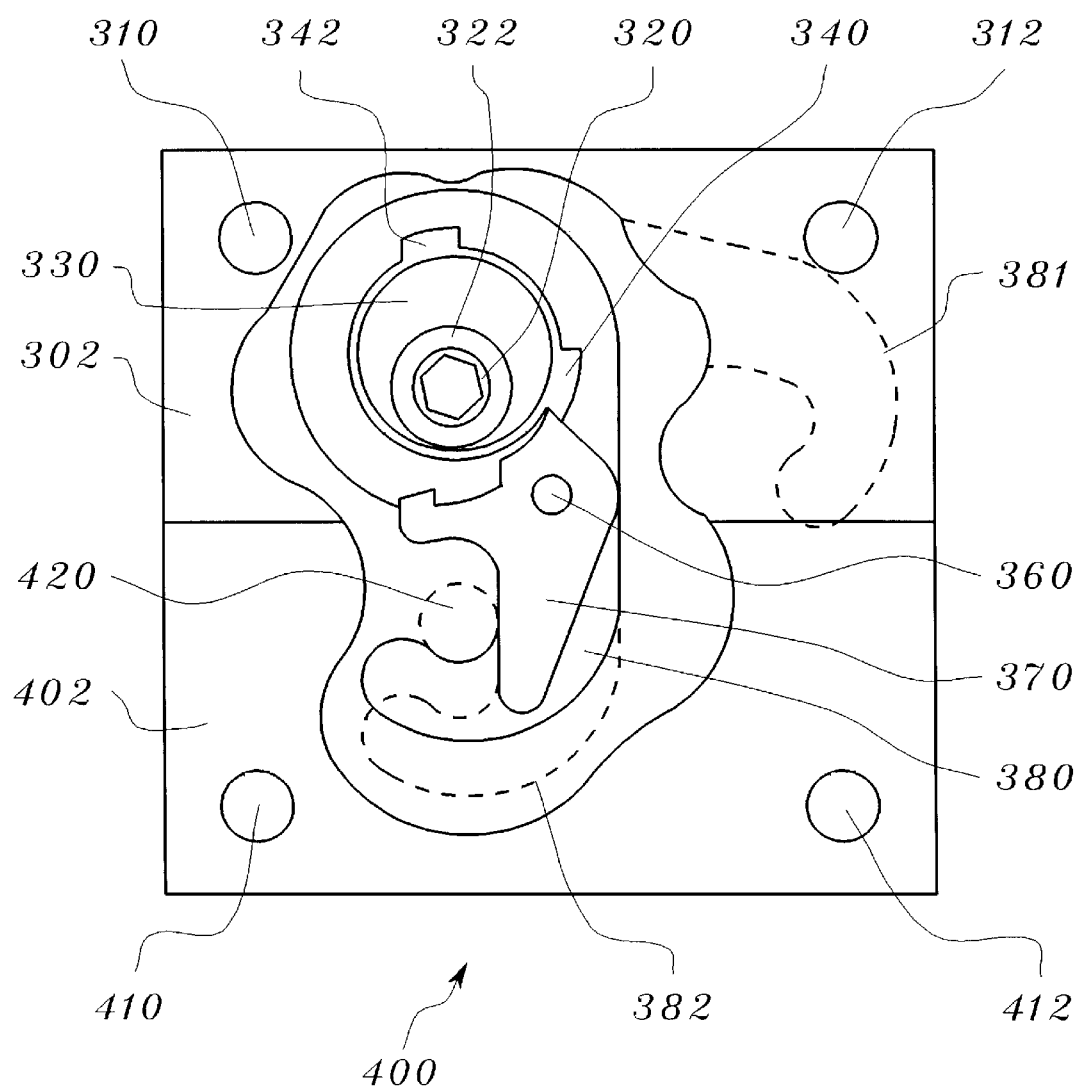
FIG. 8 shows an interior view of the latch top and latch bottom.

FIG. 8 depicts an interior view of top latch 300 and bottom latch 400. Outside hook 382 is removed so that trigger 370 and offset cam 340 can be seen. Trigger 370 rotates around pin 360 which is engaged to outside hook 382 and inside hook 380. The fully retracted position 381 for inside hook 380 is shown by a broken line. When hex nut 320 is turned by means of a hex wrench (not shown) inside hook 380 and trigger 370 (outside hook 382 not shown) will rotate downward around the axis of hex nut 320 until trigger 370 strikes latch bottom bar 420. When trigger 370 strikes latch bottom bar 420 further rotation of hex nut 320 will cause offset cam 340 to engage trigger 370 at which time further turning of hex nut 320 will cause the offset cam to lift inside hook 380 and outside hook 382 (not shown) upward into casing 302 pulling latch bottom bar 420 upward as well. Second cam 342 ensures a positive stop so that hex nut 320 cannot be over torqued and excessive pressure be brought to bear on latch bottom bar 420. Therefore, when lid 100 is pulled together with box 200 by means of latch tops 300 and latch bottoms 400, the positive stop feature prevents damage to container 10 and gasket 190. In the preferred embodiment, latch top 300 is Southco, Inc. part number R5-0074-08 and latch bottom 400 is Southco, Inc. part number R5-0079-08 which are depicted as prior art in FIG. 8.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A container comprising a lid, a plurality of latch tops, a box and a plurality of latch bottoms wherein said latch tops are attached to said lid and said latch bottoms are attached to said box; wherein said lid further comprises a top, a prong fixedly engaged to a bottom surface of said top, said prong having a prong outside wall, a prong inside wall and a prong wedge fixedly engaged between said prong outside wall and said prong inside wall, and a gasket wedged between said prong outside wall and said prong inside wall and said box further comprises a box rail having a box rail groove with a box rail ridge fixedly engaged therein for receiving said prong and said gasket so that when said top approaches said box rail ridge, said gasket deforms from pressure exerted by said prong wedge and said groove wedge so that a portion of said gasket extends beyond said outside wall and said inside wall forming a seal between said top and said box rail ridge;

wherein each of said latch tops has a latch top casing, an inside hook, an outside hook, a trigger, an offset cam and a hex nut and each of said latch bottoms have a latch bottom casing and a bar fixedly engaged to said latch bottom;

wherein said trigger is rotatably affixed between said inside hook and said outside hook by a pin engaged to said inside hook and said outside hook;

wherein said cam is rotatably engaged between said inside hook and said outside hook by said hex nut;

wherein said inside hook and said outside hook are rotatably engaged to said latch top casing by said hex nut; and wherein when said latch tops are engaged with said latch bottoms and said hex nut is rotated said trigger engages said bar and said outside hook and said inside hook draw upward into said latch top casing.

2. A container comprising:

a lid comprising;

a top, a plurality of lid rails fixedly engaged to said top, said lid rails having a plurality of latch top cavities for receiving a plurality of latch tops;

a prong fixedly attached to said top, said prong having an inside prong wall, an outside prong wall and a prong wedge;

a gasket partly compressed between said outside prong wall and said inside prong wall;

a plurality of latch tops;

a box comprising;

a base;

a plurality of box walls fixedly engaged to said base;

a plurality of latch bottoms;

a plurality of box rails fixedly engaged to said box walls, each of said box rails having a groove and a plurality of latch bottom cavities;

wherein said latch tops are positioned within said latch top cavities and affixed to said lid rails; and said latch bottoms are positioned within said latch bottom cavities and affixed to said box rails;

wherein said groove further comprises a groove wedge; and wherein when said lid is placed on said box said gasket is compressed between said prong inside wall, said prong outside wall, said prong wedge, said groove and said groove wedge.

3. The container of claim 2 wherein each of said latch tops comprises a casing, an inside hook, an outside hook, a trigger, an offset cam and a hex nut wherein said casing is fixedly attached to said lid rails, and said hook, offset cam and hex nut are rotatably attached to said casing by said hex nut; wherein said trigger is rotatably affixed to said inside hook and said outside hook by a pin;

wherein when said hex nut is turned by means of a hex wrench, said hook and said trigger rotate from a first position to a second position in which the trigger contacts a bar in said latch bottom causing the offset cam to engage pulling the inside hook and the outside hook upward into a housing until stopped.

4. The container of claim 2 wherein said lid is made from polyvinyl chloride and said box is made from polypropylene.

5. The container of claim 2 wherein said gasket is made from Butyl Rubber or Ethylene Propylene Rubber with a durometer rating of 60.

6. The container of claim 2 wherein said gasket is made from Butyl Rubber or Ethylene Propylene Rubber with a durometer rating in the range of less than or equal to 70 and greater than or equal to 40.

7. The container of claim 2 having a prong wedge and a groove wedge so that when the lid and the container are connected by said latch tops and said latch bottoms the distance between said prong wedge and said groove wedge is in the range of 0.10 to 0.12 inches.

8. The container of claim 2 wherein the distance between the center points of said latch tops and said latch bottoms does not exceed 12 inches and the distance from the center points of said latch tops and said latch closest to a corner of said lid and said box does not exceed 6 inches.

9. The container of claim 2 wherein the top and the lid rails are fixedly engaged by a solder means selected from the group consisting of triple bead solder and triangle bead solder.

10. The container of claim 2 wherein the base has a recess for receiving the walls.

11. The container of claim 2 wherein the base and the box walls are fixedly engaged by a solder means selected from the group consisting of triple bead solder and triangle bead solder.

12. The container of claim 2 wherein the plurality of lid rails and the top are fixedly engaged by a solder means selected from the group consisting of triple bead solder and triangle bead solder.

13. The container of claim 2 wherein the box is made from polypropylene with a specific gravity of 0.905.

14. The container of claim 2 wherein the lid is made from polyvinyl chloride with a specific gravity in the range of 1.30 to 1.58.

15. A container comprising:
a lid comprising;
  a top fixedly connected to a plurality of first lid rails and a plurality of second lid ails, said first lid rails and said second lid rails having a plurality of latch top compartments for receiving a plurality of latch tops;
  a rail blister fixedly engaged to said top;
  the plurality of latch tops attached to said first lid rails and said second lid rails, said each of said plurality of latch tops comprising a latch top casing, a plurality of hooks, a trigger, an offset cam and a hex nut;
a box comprising;
  a base;
  a plurality of first box walls fixedly engaged to said base and a plurality of second box walls fixedly engaged to said base;
  a plurality of latch bottoms;
  a plurality of first box rails fixedly engaged to said first box walls and a plurality of second box rails fixedly engaged to said second box walls, said plurality of first box rails and said plurality of said second box rails having a plurality of latch bottom cavities;
  a box blister fixedly engaged to said first box rails and to said second box rails;
  a gasket removably engaged to said first box rails and said second box rails wherein said gasket is positioned over said box blister;
wherein when said lid is placed on said box, said rail blister contacts said gasket above said box blister and said latch tops engage said latch bottoms;
wherein each of said latch bottoms has a latch bottom casing and a bar fixedly engaged to said latch bottom;
wherein said latch top casing is fixedly attached to said lid rails, and said plurality of hooks, offset cam and hex nut are rotatably attached to said latch top casing and said trigger is rotatably attached to said plurality of hooks; wherein when said hex nut is turned by means of a hex wrench, said plurality of hooks and said trigger rotate from a first position to a second position in which the trigger contacts the bar in said latch bottom casing causing the offset cam to engage pulling the plurality of hooks upward into said latch top casing until stopped;
wherein said gasket is made from Butyl Rubber or Ethylene Propylene Rubber with a durometer rating less than or equal to 70 and greater than or equal to 40.

* * * * *